United States Patent
Suzuki et al.

(10) Patent No.: US 6,417,023 B2
(45) Date of Patent: Jul. 9, 2002

(54) METHOD FOR PRODUCING SOLID-STATE IMAGE-SENSING DEVICE

(75) Inventors: Ryoji Suzuki; Takahisa Ueno; Hirofumi Sumi; Keiji Mabuchi, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/799,995

(22) Filed: Mar. 6, 2001

Related U.S. Application Data

(62) Division of application No. 09/499,449, filed on Feb. 7, 2000.

Foreign Application Priority Data

Feb. 9, 1999 (JP) .......... P11-031644
Oct. 13, 1999 (JP) .......... P11-291363

(51) Int. Cl.$^7$ .......... H01L 21/00
(52) U.S. Cl. .......... 438/73
(58) Field of Search .......... 438/57, 73, 199, 438/80, 81, 238, 241; 257/461, 463

(56) References Cited

U.S. PATENT DOCUMENTS 6,287,886 B1 * 9/2001 Pan .......... 438/57
2001/0019851 A1 * 9/2001 Connolly et al. .......... 438/73

* cited by examiner

*Primary Examiner*—Keith Christianson
(74) *Attorney, Agent, or Firm*—Sonnenschein, Nath & Rosenthal

(57) ABSTRACT

A solid-state image-sensing device has pn-junction sensor parts isolated corresponding to pixels by a device isolation layer. The solid-state image-sensing device includes a first-conductivity-type second semiconductor well region formed between a first-conductivity-type first semiconductor well region and the device isolation layer. When the device is operating, a depletion layer of each sensor part spreads to the first semiconductor well region, which is beneath each of the sensor parts.

6 Claims, 18 Drawing Sheets

METHOD FOR PRODUCING SOLID-STATE IMAGE-SENSING DEVICE

RELATED APPLICATION DATA

This application is a divisional of copending application Ser. No. 09/499,449, filed Feb. 7, 2000. The present and foregoing applications claim priority to Japanese Application No. P11-031644, filed Feb. 9, 1999, and Japanese Application No. P11-291363, Oct. 13, 1999. All of the foregoing applications are incorporated herein by reference to the extent permitted by law.

BACKGROUND OF THE INVENTION

1. Field of the Invention

The present invention relates to solid-state image-sensing devices, and particularly to a metal-oxide-semiconductor (MOS) or complementary-metal-oxide-semiconductor (CMOS) solid-state image-sensing device and a method for producing the device.

2. Description of the Related Art

As a type of solid-state image-sensing device, an MOS or CMOS solid-state image-sensing device is known that includes unit pixels each including a photodiode sensor and a switching device and that reads signal charge accumulated in the sensor by photoelectric conversion, converts the charge into a voltage or current, and outputs it. In the MOS or CMOS solid-state image-sensing device, MOS transistors or CMOS transistors are used as, for example, switching devices for pixel selection and switching devices for reading signal charge. Also in peripheral circuits such as a horizontal scanning circuit and a vertical scanning circuit, MOS transistors or CMOS transistors are used, so that there is an advantage in that the transistors can be produced together with the switching devices.

Hitherto, in a MOS or CMOS solid-state image-sensing device using pn-junction transistors as sensors, the sensors of pixels are formed so that the pixels are isolated in the form of an X-Y matrix by a device isolation layer resulting from local oxidation, i.e., a so-called "LOCOS (local oxidation of silicon) layer".

As shown in FIG. 21, a photodiode 1 to be used as a sensor is formed by forming a p-type semiconductor well region 3 on, for example, an n-type silicon substrate 2, forming a device isolation layer (LOCOS layer) 4 resulting from local oxidation, and performing ion implantation of an n-type impurity 6 such as arsenic (As) or phosphorus (P) in the surface of the p-type semiconductor well region 3 through a thin insulating film (e.g., an $SiO_2$ film) so that an n-type semiconductor layer 7 is formed.

In the sensor (photodiode) 1, it is necessary that a depletion layer be enlarged for increasing the photoelectric conversion efficiency so that even signal charge photoelectrically converted at a deeper position can be used.

In order to dope the n-type impurity 6 in the formation of the photodiode 1 to be used as a sensor, ion implantation is performed using a photoresist layer 8 aligned on the device isolation layer 4 to protect other regions, as shown in FIG. 21. Thus, a pn-junction j appears at an end A of the device isolation layer 4. It is known that a stress generates crystal defects such as dislocation at the end A of the device isolation layer 4. Accordingly, when the depletion layer, generated by reverse biasing the pn-junction j, occurs in the region of at the end of the device isolation layer, which has the crystal defects, a leakage current is increased by the electric field. When the leakage current is increased in the sensor (photodiode) 1, a signal charge is generated and forms a dark current, even if no light is incident. Since the dark current is generated by the crystal defects, each sensor 1 has a different amount of generated dark current, which appears as nonuniformity of the image quality.

SUMMARY OF THE INVENTION

Accordingly, it is an object of the present invention to provide a solid-state image-sensing device designed so that photoelectric conversion efficiency in sensor parts can be increased.

It is another object of the present invention to provide a solid-state image-sensing device designed so that a dark current resulting from leakage current can be reduced, and to provide a method for producing the device.

To these ends, according to an aspect of the present invention, the foregoing objects are achieved through provision of a solid-state image-sensing device having pn-junction sensor parts isolated corresponding to pixels by a device isolation layer. The solid-state image-sensing device includes a first-conductivity-type second semiconductor well region formed between a first-conductivity-type first semiconductor well region and the device isolation layer. In the device, when the device is operating, a depletion layer of each of the sensor parts spreads to the first semiconductor well region, which is beneath each of the sensor parts.

Preferably, the second semiconductor well region is simultaneously formed with the semiconductor well regions formed after the formation of the device isolation layer in a CMOS transistor.

According to another aspect of the present invention, the foregoing objects are achieved through provision of a solid-state image-sensing device having pn-junction sensor parts isolated corresponding to pixels by a device isolation layer resulting from local oxidation. The solid-state image-sensing device includes a semiconductor region of a conductivity type opposite to the conductivity type of a charge accumulating region of each of the sensor parts, and the semiconductor region is formed between the charge accumulating region of each sensor part and the device isolation layer.

Preferably, the solid-state image-sensing device further includes a second semiconductor well region formed between the device isolation layer and a first semiconductor well region beneath the device isolation layer, and when the device is operating, the depletion layer of each of the sensor parts spreads to the first semiconductor well region, which is beneath each of the sensor parts.

The semiconductor region may be formed by extending a portion of a second semiconductor well region formed between the device isolation layer and a first semiconductor well region beneath the device isolation layer.

According to a further aspect of the present invention, the foregoing objects are achieved through provision of a solid-state image-sensing device including pn-junction sensor parts isolated corresponding to pixels by a device isolation layer resulting from trench isolation. The solid-state image-sensing device includes a semiconductor region of a conductivity type opposite to the conductivity type of the charge accumulating region of each of the sensor parts, and the semiconductor region is formed to extend from the device isolation layer to a pixel region.

Preferably, the opposite-conductivity-type semiconductor region is formed by extending a portion of a semiconductor well region.

According to a still further aspect of the present invention, the foregoing objects are achieved through provision of a method for producing a solid-state image-sensing device which includes the step of forming, by performing ion implantation, a semiconductor region after forming a device isolation layer resulting from local oxidation, wherein the device isolation layer isolates pn-junction sensor parts in correspondence with pixels; the conductivity type of the semiconductor region is opposite to the conductivity type of a charge accumulating region of each of the sensor parts; and an end of the semiconductor region is positioned at the side of the parts except for an end of the device isolation layer.

Preferably, the semiconductor region is formed by a second semiconductor well region formed between a first semiconductor well region and the device isolation layer.

In the method, after forming the device isolation layer, the semiconductor region may be formed by forming, beneath the device isolation layer, a second semiconductor well region leading to a first semiconductor well region.

According to yet another aspect of the present invention, the foregoing objects are achieved through provision of a method for producing a solid-state image-sensing device which includes the steps of: forming a device isolation layer resulting from local oxidation, the device isolation-layer isolating pn-junction sensor parts corresponding to pixels, and for forming a gate electrode of a read transistor connected to each of the sensor parts; and forming, by performing ion implantation, a semiconductor region of a conductivity type opposite to the conductivity type of the charge accumulating region of each of the sensor parts so that an end of the semiconductor region is positioned at the side of the sensor parts except for an end of the device isolation layer, with the gate electrode being used as a reference position.

According to still another aspect of the present invention, the foregoing objects are achieved through provision of a method for producing a solid-state image-sensing device which includes the step of forming a semiconductor region of a conductivity type opposite to the conductivity type of a charge accumulating region in each of pn-junction sensor parts so as to surround a device isolation layer resulting from trench isolation, wherein the device isolation layer isolates the pn-junction sensor parts corresponding to pixels.

According to a more aspect of the present invention, the foregoing objects are achieved through provision of a method for producing a solid-state image-sensing device which includes the step of forming, after forming, on a semiconductor substrate, trenches for isolating pn-junction sensor parts corresponding to pixels, and after forming a semiconductor region of a conductivity type opposite to the conductivity type of a charge accumulating region of each of the sensor parts so as to surround each trench, a device isolation layer by embedding an insulating material in each trench.

According to the present invention, photoelectric conversion efficiency in sensor parts in a solid-state image-sensing device can be increased, which makes it possible to provide a solid-state image-sensing device with high sensitivity.

According to the present invention, sensor parts having high photoelectric conversion efficiency and a low dark current can be formed without increasing production steps.

DESCRIPTION OF THE PREFERRED EMBODIMENTS

Figure 1:
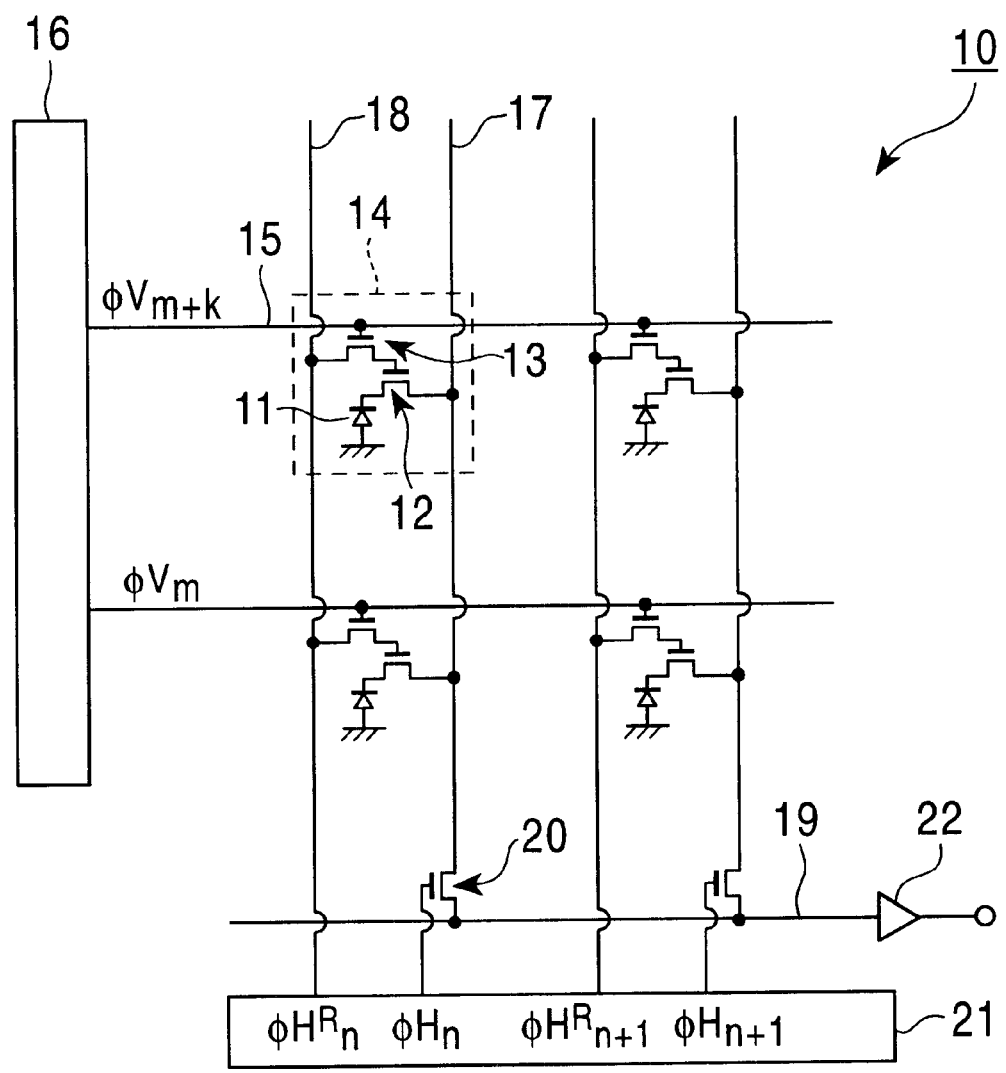
FIG. 1 is a block diagram showing an embodiment of a solid-state image-sensing device according to the present invention.

FIG. 1 shows a solid-state image-sensing device of, for example, a CMOS type, according to an embodiment of the present invention.

A solid-state image-sensing device 10 includes: an image sensing region formed by providing, in the form of a matrix, a plurality of unit pixels 14 in which each unit pixel includes a photodiode (i.e., a pn-junction sensor) 11 for performing photoelectric conversion, a vertical-selection switching device (e.g., a MOS transistor) 13 for selecting a pixel, and a read switching device (e.g., a MOS transistor) 12; a vertical scanning circuit 16 for outputting vertical scanning pulses $\phi V [\phi V_1, \ldots \phi V_m, \ldots \phi V_{m+k}, \ldots]$ to vertical selection lines 15 to which the control electrodes (so-called "gate electrodes") of the vertical-selection switching devices 13 for each row are commonly connected; vertical signal lines 17 to which main electrodes of the read switching devices 12 for each column are commonly connected to each column; read pulse lines 18 connected to main electrodes of the vertical-selection switching devices 13; horizontal switching devices (e.g., MOS transistors) 20 whose main electrodes are connected to the vertical signal lines 17 and horizontal signal lines 19; a horizontal scanning circuit 21 connected to the control electrodes (so-called "gate electrodes") of the horizontal switching devices 20 and the read pulse lines 18; and an amplifier 22 connected to the horizontal signal lines 19.

In each unit pixel 14, one main electrode of the read switching device 12 is connected to the photodiode 11, and another main electrode of the switching device 12 is connected to each vertical signal line 17. One main electrode of the vertical-selection switching device 13 is the control electrode (so-called "gate electrode") of the read switching device 12, while another main electrode of the switching device 13 is connected to each read pulse line 18, and the control electrode (so-called "gate electrode") is connected to each vertical selection line 15.

From the horizontal scanning circuit 21, horizontal scanning pulses $\phi H [\phi H_1, \ldots \phi H_n, \phi H_{n+1}, \ldots]$ are supplied to the control electrodes (so-called "gate electrode") of the horizontal switching devices 20, and horizontal read pulses $\phi H^R [\phi H^R_1, \ldots \phi H^R_n, \phi H^R_{n+1}, \ldots]$ are supplied to the read pulse lines 18.

The basic operation of the solid-state image-sensing device 10 is as follows.

The vertical-selection switching device 13 that receives vertical scanning pulse $\phi V_m$ from the vertical scanning circuit 16 and the read pulse $\phi H^R_n$ from the horizontal scanning circuit 21 creates a pulse as the product of the pulses $\phi V_m$ and $\phi H^R_n$, and uses the product pulse to control the control electrode of the read switching device 12, whereby signal charge photoelectrically converted by the photodiode 11 is read via the vertical signal line 17.

The signal charge is led in a horizontal period of the picture to the horizontal signal line 19 via the horizontal switching device 20 controlled by the horizontal scanning pulse $\phi H_n$ from the horizontal scanning circuit 21. The amplifier 22 converts the signal charge into a signal voltage, and outputs it.

Figure 2:
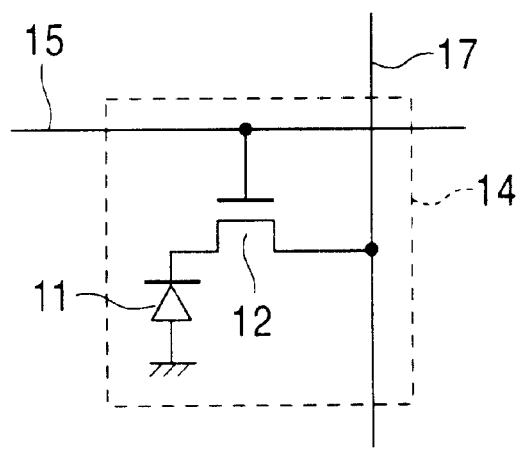
FIG. 2 is a circuit diagram showing another example of a unit pixel applied to a solid-state image-sensing device of the present invention.
Figure 3:
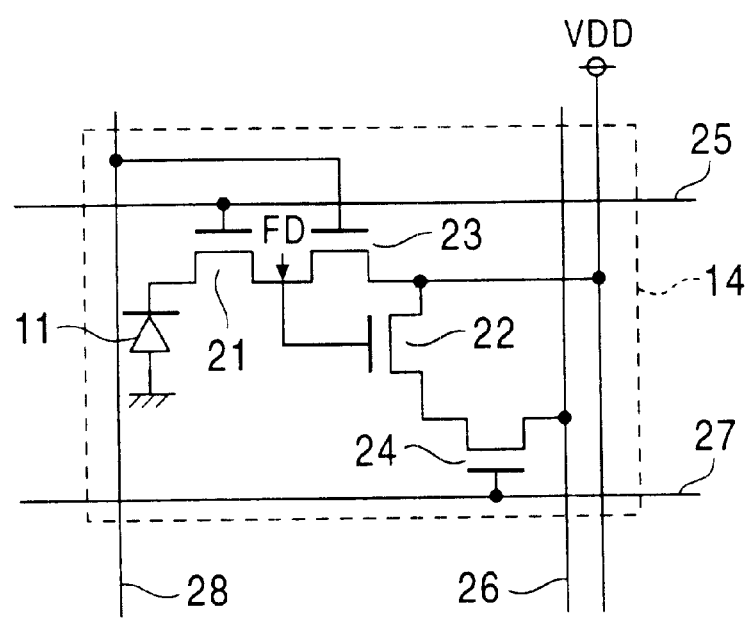
FIG. 3 is a circuit diagram showing another example of a unit pixel applied to a solid-state image-sensing device of the present invention.

The construction of the unit pixel 14 is not limited to that described above, but may be variously modified, such as those shown in FIGS. 2 and 3.

In FIG. 2, a unit pixel 14 includes a photodiode 11 and a read MOS transistor 12 connected thereto. One main electrode of the read MOS transistor 12 is connected to a vertical signal line 17, and the gate electrode is connected to a vertical selection line 15.

In FIG. 3, a unit pixel 14 includes a photodiode 11, a read MOS transistor 21, a floating diffusion (FD) amplifying MOS transistor 22, a FD reset MOS transistor 23, and a vertical-selection MOS transistor 24. One main electrode of the read MOS transistor 21 is connected to the photodiode 11, and another main electrode of the transistor 21 is connected to one main electrode of the FD reset MOS transistor 23. The FD amplifying MOS transistor 22 is connected between another main electrode of the FD reset MOS transistor 23 and one main electrode of the vertical-selection MOS transistor 24. The gate electrode of the FD amplifying MOS transistor 22 is connected to a floating diffusion (FD) point at the midpoint of the read MOS transistor 21 and the FD reset MOS transistor 23. The gate electrode of the read MOS transistor 21 is connected to a vertical-read line 25. Another main electrode of the FD reset MOS transistor 23 is connected to a power supply VDD, and the gate electrode of the transistor 23 is connected to a horizontal-reset line 28. Another main electrode of the vertical-selection MOS transistor 24 is connected to a vertical signal line 26, and the gate electrode of the transistor 24 is connected to a vertical selection line 27.

Figure 4:
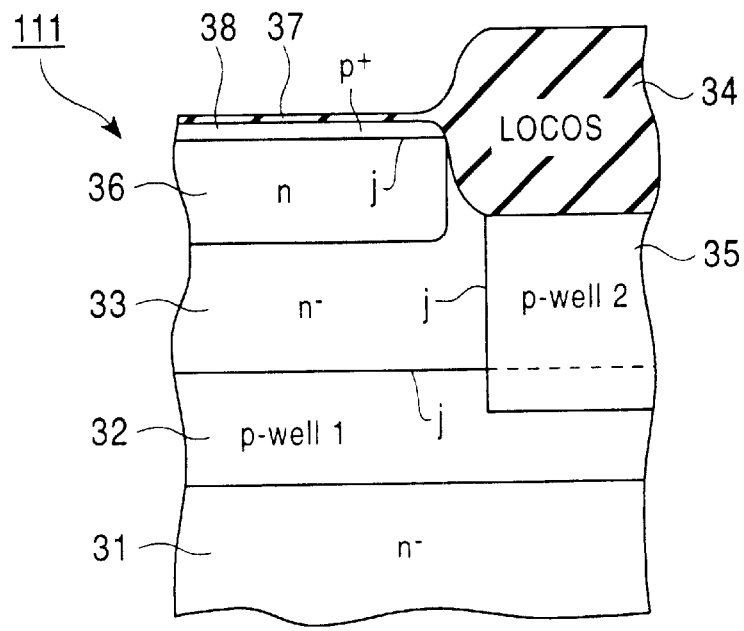
FIG. 4 is a main part sectional view showing an embodiment of a sensor in a solid-state image-sensing device according to the present invention.

FIG. 4 shows a modification of the sensor 11 in the solid-state image-sensing device 10.

A sensor (photodiode) 111 as the modification is formed by: forming a first semiconductor well region 32 of a first conductivity type, e.g., a p-type, on a silicon semiconductor substrate 31 of a second conductivity type, e.g., an n-type; forming a high-resistance semiconductor region, e.g., a low-concentration n-type semiconductor region 33, on the first p-type semiconductor well region 32; forming a second p-type semiconductor region 35 leading to the first p-type semiconductor well region 32, beneath a device isolation layer (i.e., LOCOS layer) 34 resulting from local oxidation, which isolates the sensor 111 for each pixel; and forming a high-concentration n-type semiconductor region 36 on the surface of the low-concentration n-type semiconductor region 33 isolated by the device isolation layer 34 so that a pn-junction j is formed between the low-concentration n-type semiconductor region 33 and the first p-type semiconductor well region 32 and so that a depletion layer of the sensor part expands to the first p-type semiconductor well region 32 during operation.

The first p-type semiconductor well region 32 is formed at a predetermined depth of the substrate 31, and the low-concentration n-type semiconductor region 33 is formed on the surface region of the substrate so as to be separated by the first p-type semiconductor well region 32. The high-concentration n-type semiconductor region 36 acts as a substantial charge-accumulating region.

It is also possible to employ a sensor structure in which a high-concentration p-type semiconductor region 38 is formed at the interface between the high-concentration n-type semiconductor region 36 and an insulating film (e.g., $SiO_2$ film) 37. In the sensor 111, pn-junctions j are formed between the high-concentration n-type semiconductor region 36 and the high-concentration p-type semiconductor region 38 and between the low-concentration n-type semiconductor region 33 and the second p-type semiconductor well region 35.

The second p-type semiconductor well region 35 can be simultaneously formed when, for example, a p-type semiconductor well of a CMOS transistor in a peripheral circuit is formed.

Figure 13A:
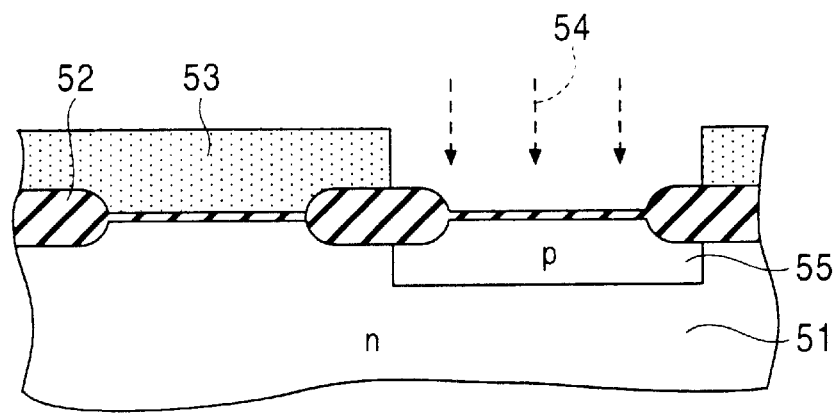
FIGS. 13A to 13C are sectional views showing a process for producing a CMOS transistor included in the peripheral circuit of a solid-state image-sensing device.
Figure 13B:
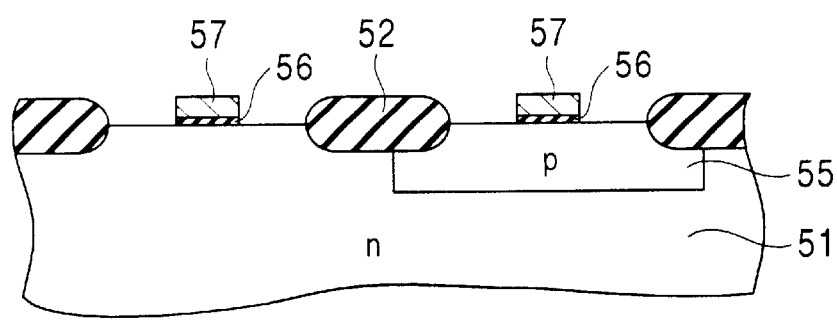
Figure 13C:
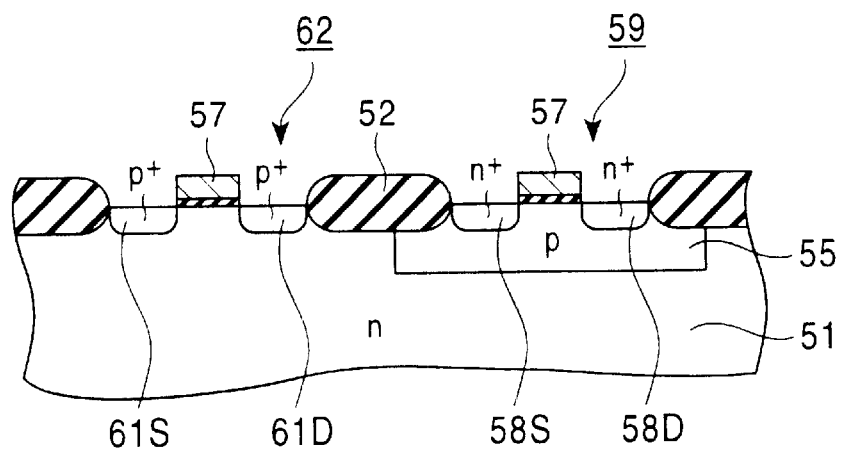

In the CMOS transistor, after a field insulating layer (so-called "device isolation layer) 52 is formed by local oxidation, as shown in FIGS. 13A to 13C, a p-type semiconductor well region 55 is formed (see FIG. 13A) by performing ion implantation of a p-type impurity 54 such as boron in one device forming region, using a photoresist layer 53 as a mask.

Next, gate electrodes 57 composed of, for example, polycrystal silicon, are formed on the p-type semiconductor well region 55 and the n-type semiconductor substrate 51 as another device forming region (see FIG. 13B), while providing gate insulating films 56 therebetween.

Next, by using each gate electrode 57 as a mask, and performing self-aligning, ion implantation of an n-type impurity is performed in the p-type semiconductor well region 55 to form an n-type source region 58S and a drain region 58D so that an n-channel MOS transistor 59 is formed, and ion implantation of a p-type impurity is performed in the n-type semiconductor substrate 51 to form a p-type source region 61S and a drain region 61D so that a p-channel MOS transistor 62 is formed, whereby a CMOS transistor is obtained.

A process in which the p-type semiconductor well region 55 is formed after forming the field insulating layer 52 is called a "retrograde p-well process".

The above-described second p-type semiconductor well region 35 in FIG. 4 can be formed simultaneously with the p-type semiconductor well region 55 in FIG. 13. Thus, the sensor 111, in which the expansion of a depletion layer described below is deepened to increase a photoelectric conversion efficiency, can be formed without increasing the number of producing steps.

In addition, the second p-type semiconductor well region 35 is formed after forming the device isolation layer 34, as shown in FIG. 4. Thus, the second p-type semiconductor well region 35 can be selectively formed beneath the device isolation layer 34 excluding the sensor-formed region without being affected by diffusion due to thermal processing performed during the formation of the device isolation layer.

According to the solid-state image-sensing device 10 having the sensors 111 in this embodiment, by selectively forming, beneath only the device isolation layer 34 excluding the sensor region, the second p-type semiconductor well region 35 leading to the first p-type semiconductor well region 32, and forming pn-junctions with the high-concentration n-type semiconductor region 36, the low-concentration n-type semiconductor region 33, and the first p-type semiconductor well region 32, photodiodes, that is, sensors 111 are formed, whereby the expansion of the depletion layer in each sensor 111 is deepened during operation, and even signal charge photoelectrically converted at a deep position can be accumulated in the high-concentration n-type semiconductor region 36 as a charge accumulating region. Therefore, the photoelectric conversion efficiency increases, making it possible to obtain a solid-state image-sensing device with higher sensitivity.

Figure 5:
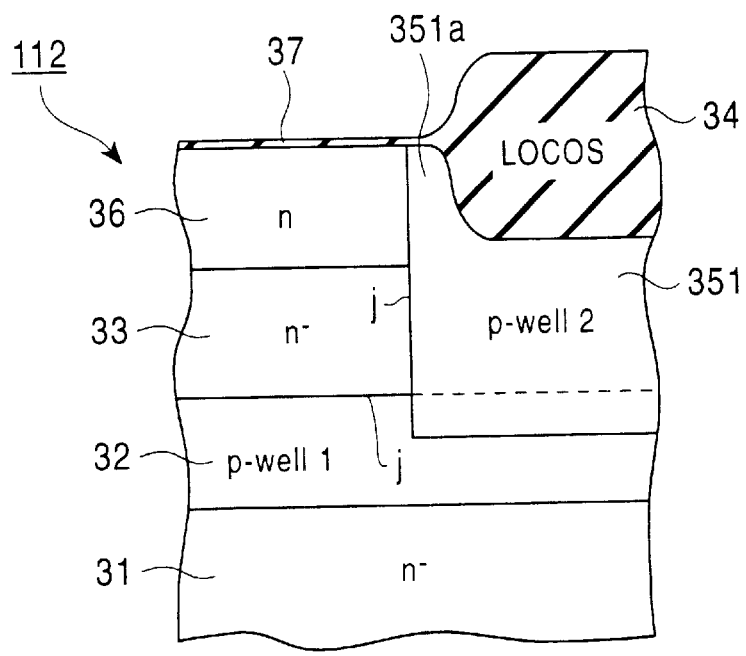
FIG. 5 is a sectional view showing another embodiment of the sensor in the solid-state image-sensing device according to the present invention.

FIG. 5 shows another embodiment of the sensor 11 (see FIG. 1) according to the present invention.

A sensor (photodiode) 112 according to this embodiment is intended to increase photoelectric conversion efficiency and to reduce a dark current due to leakage current.

The sensor 112 is formed, similarly to the foregoing description, by: forming a first semiconductor well region 32 of a first conductivity type, e.g., a p-type, on a semiconductor substrate 31 of a second conductivity type, e.g., an n-type; forming a low-concentration n-type semiconductor region 33 on the first p-type semiconductor well region 32; forming a high-concentration n-type semiconductor region 36 on the surface of the low-concentration n-type semiconductor region 33, in which pixel isolation is performed by a device isolation layer 34 resulting from local oxidation; and forming a pn-junction j between the low-concentration n-type semiconductor region 33 and the first p-type semiconductor well region 32 so that a depletion layer of the sensor expands to the first p-type semiconductor well region 32 during operation.

In this embodiment, in particular, a second p-type semiconductor well region 351 leading to the first p-type semiconductor well region 32 is formed beneath the device isolation layer 34 for pixel isolation, and part 351a of the second p-type semiconductor well region 351 is simultaneously provided being extended between the n-type semiconductor region 36 and the device isolation layer 34, in which a substantial charge accumulating region of the sensor is formed therebetween.

In other words, an end of the second p-type semiconductor well region 351 is formed so as to be positioned on the sensor side apart from an end of the device isolation layer 34, and an end of the n-type semiconductor region 36 as the charge accumulating region of the sensor 112 is provided so as to touch an extended portion of the second p-type semiconductor well region 351a. In the sensor 112, a pn-junctions j is also formed between each n-type semiconductor region 33 or 36 and the extended portion of the p-type semiconductor well region 351a.

Figure 7A:
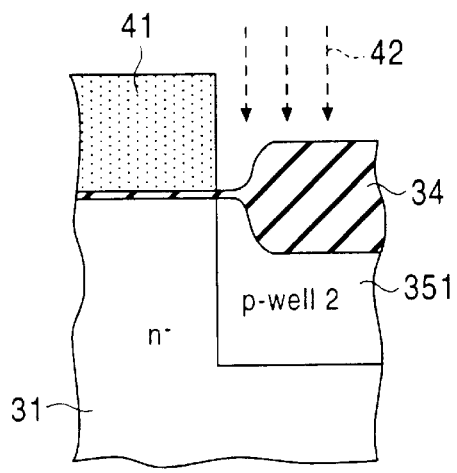
FIGS. 7A to 7D are sectional views showing a process for producing the sensors in FIGS. 5 and 6.
Figure 7B:
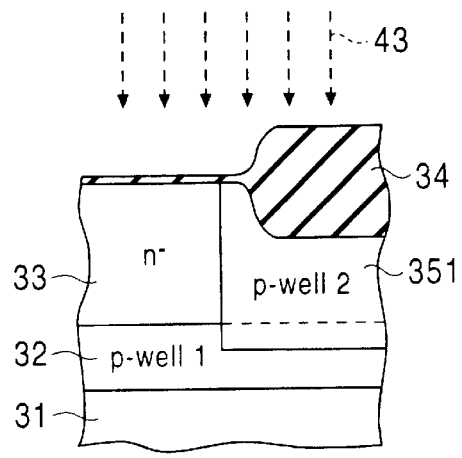
Figure 7C:
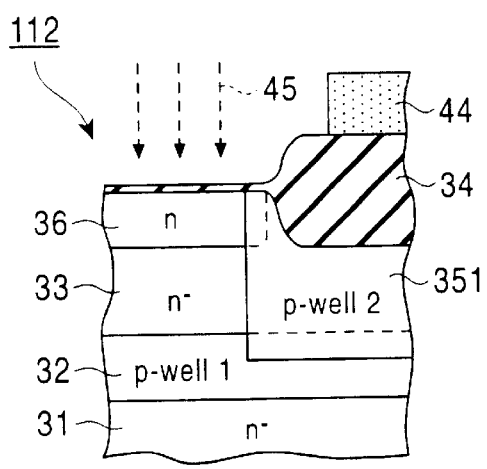

FIGS. 7A to 7C show a method for producing the sensor 112.

Initially, as shown in FIG. 7A, after forming a device isolation layer 34 used for local oxidation on the surface of an n-type semiconductor substrate 31, a predetermined pattern photoresist layer 41 in which a photoresist end 41a is positioned on the sensor side (in the active region of a photodiode) apart from an end of the device isolation layer 34 is formed so as to cover a region for forming the sensor part of the substrate 31. The photoresist layer 41 is used as a mask to perform ion implantation of a p-type impurity 42, whereby a second p-type semiconductor well region 351 is formed. The second p-type semiconductor well region 351 is formed so that an end thereof, namely, an end of the extended portion 351a is positioned on the side for forming the sensor part, which is apart from an end of the device isolation layer 34.

Next, as shown in FIG. 7B, after removing the photoresist layer 43, by performing ion implantation of a p-type impurity 43 in the entire region for forming the sensor part, which includes the part beneath the device isolation layer 34, a first p-type semiconductor well region 32 touching the lower part of the second p-type semiconductor well region 351 is formed at a predetermined depth of the substrate 31. By forming the first p-type semiconductor well region 32, a low-concentration n-type semiconductor region 33 including an isolated portion of the substrate 31 is formed in a region surrounded by the first p-type semiconductor well region 32 and the second p-type semiconductor well region 351.

Next, as shown in FIG. 7C, by forming a photoresist layer 44 in a part excluding the sensor forming region, and performing ion implantation of an n-type impurity 45, a high-concentration n-type semiconductor region 36 to be used as a charge accumulating region is formed on the surface of the low-concentration n-type semiconductor region 33. This forms pn-junctions j between the n-type semiconductor region 33 and the first semiconductor well region 32, and between each n-type semiconductor region 36 or 33 and the extended portion 351a of the second p-type semiconductor well region, whereby the desired photodiode, namely, the sensor 112 is formed.

The impurity concentrations of the regions are as follows:
second semiconductor well region 351>n-type semiconductor region 36; and n-type semiconductor region 36>n-type semiconductor region 33.

According to a solid-state image-sensing device provided with the above-described sensor 112, by forming the second p-type semiconductor well region (so-called "channel stop region") 351 so as to be extended to the sensor side than to the end of the device isolation layer 34, the pn-junctions of the photodiode forming the sensor 112 can be isolated from an end of the device isolation layer 34 having crystal defects such as dislocation, in other words, from a semiconductor region in the vicinity of the device isolation layer 34, whereby, when the pn-junctions are reverse biased, the depletion layer can be generated apart from the end of the device isolation layer 34.

Accordingly, the generation of a leakage current in the vicinity of the device isolation layer 34 is suppressed, and the dark current decreases.

Similarly to FIG. 4, in the sensor 112, the regions 36 and 33 form one n-type semiconductor region constituting the photodiode in connection with the second semiconductor well region 351, so that the expansion of the depletion layer is deepened and the photoelectric conversion efficiency can be increased.

According to the producing method shown in FIGS. 7A to 7C, ion implantation is used to form the second p-type semiconductor well region 351 after forming the device isolation layer 34. Thus, there is no influence of thermal processing in the formation of the device isolation layer 34. In other words, the second p-type semiconductor well region 351 can be formed with positional precision without being re-diffused.

Also when forming the second p-type semiconductor well region 351 having the extended portion 351a on the sensor side apart from the end of the device isolation layer 34, its alignment with the device isolation layer 34 is facilitated. Accordingly, the second p-type semiconductor well region 351 can be easily and accurately formed. In addition, in this embodiment, the second p-type semiconductor well region 351 can be simultaneously formed, together with the p-type well region 55 in the production of the peripheral circuit's CMOS transistor shown in the above-described FIGS. 13A to 13C. Thus, there is no increase in the number of production steps.

Figure 6:
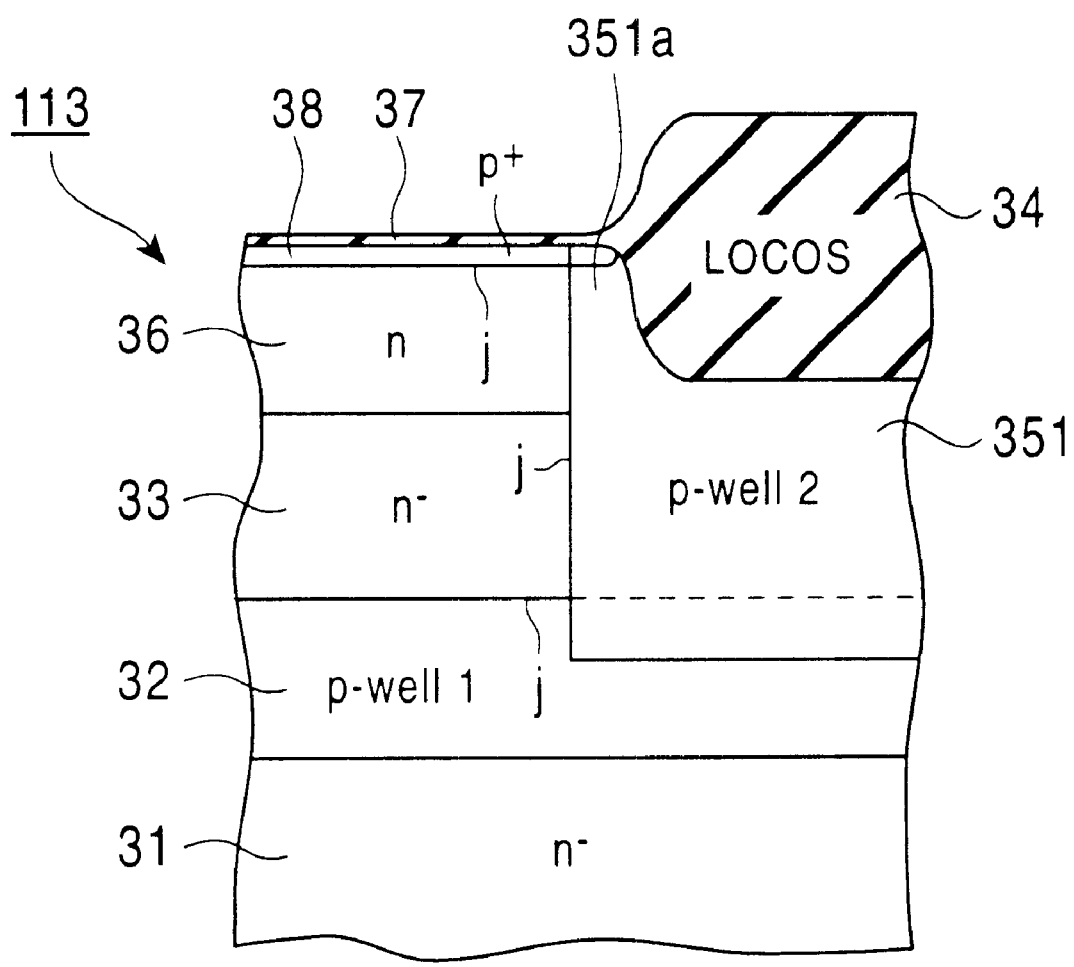
FIG. 6 is a sectional view showing another embodiment of the sensor in the solid-state image-sensing device according to the present invention.

FIG. 6 shows another embodiment of the sensor 11 (see FIG. 1) according to the present invention.

A sensor (photodiode) 113 according to this embodiment is formed such that, in the above-described sensor structure shown in FIG. 5, a high-concentration p-type semiconductor region 38 is formed between an n-type semiconductor region 36 to be used as a charge accumulating region and a top insulating film 37 so as to touch a second p-type semiconductor well region 351. Other components are identical to those in FIG. 5. Accordingly, the corresponding components are denoted by identical reference numerals, and repeated descriptions are omitted.

Figure 7D:
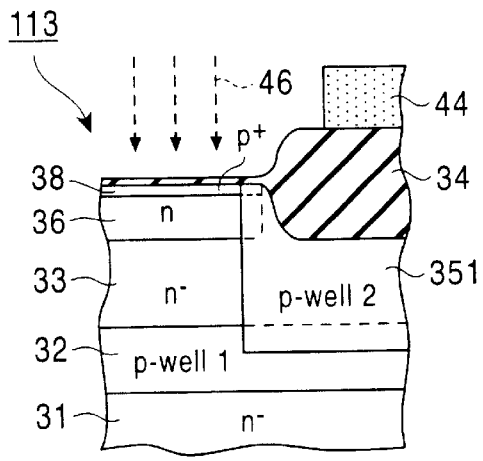

The sensor 113 can be produced such that, after using ion implantation to form the n-type semiconductor region 36 shown in FIG. 7C, a p-type semiconductor region 38 is formed on the surface of the n-type semiconductor region 36 by performing ion implantation of a p-type impurity 46, as shown in FIG. 7D.

According to a solid-state image-sensing device provided with the sensor 113 according to this embodiment, by employing a structure having a p-type semiconductor region 38 on the surface of the n-type semiconductor region 36, all pn-junctions other than that in the gate of a read MOS transistor (not shown) can be provided in the bulk. In other words, in the sensor 113, in addition to effects in the sensor 112 in FIG. 5, the dark current can be more reduced because the depletion layer is positioned apart from an interface with the sensor top insulating film 37, i.e., an Si—SiO$_2$ interface.

Figure 8:
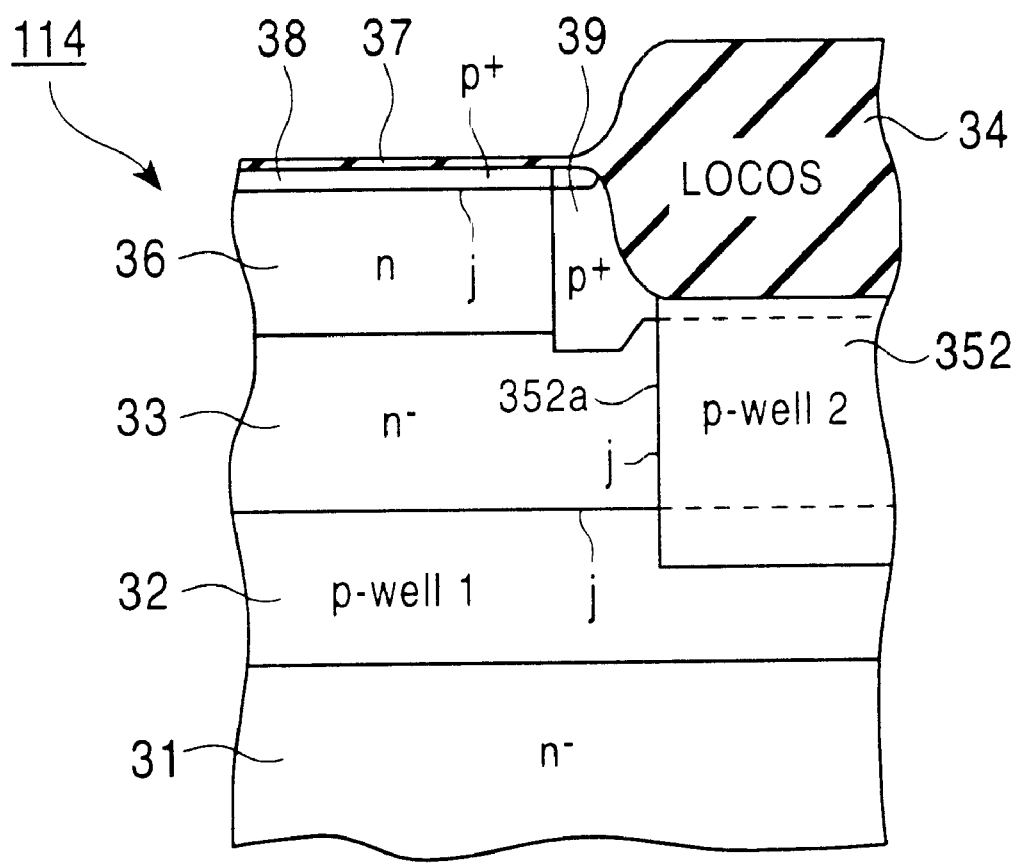
FIG. 8 is a main part sectional view showing another embodiment of the sensor in the solid-state image-sensing device according to the present invention.

FIG. 8 shows another embodiment of the sensor 11 (see FIG. 1) according to the present invention.

A sensor (photodiode) 114 according to this embodiment is formed, similarly to the foregoing description, by: forming a first semiconductor well region 32 of a first conductivity type, e.g., a p-type, on a semiconductor substrate 31 of a second conductivity type, e.g., an n-type; forming a low-concentration n-type semiconductor region 33 on the first p-type semiconductor well region 32; forming a high-concentration n-type semiconductor region 36 on the surface of the low-concentration n-type semiconductor region 33, in which pixel isolation is performed by a device isolation layer 34 resulting from local oxidation; and forming a pn-junction j between the low-concentration n-type semiconductor region 33 and the first p-type semiconductor well region 32 so that a depletion layer of the sensor expands to the first p-type semiconductor well region 32 during operation.

In this embodiment, in particular, a second p-type semiconductor well region 352 that has an end 352a at an inner position than an end of the device isolation layer 34 and that leads to a first p-type semiconductor well region 32 is formed beneath a device isolation layer 34 for pixel isolation, and a p-type semiconductor region, i.e., a so-called "p-type plug region 39" is formed between an end of the device isolation layer 34 and an n-type semiconductor region 36 to be used as a charge accumulating region. The p-type plug region 39 is formed so as to be connected to the second p-type semiconductor well region 352.

In addition, in FIG. 8, a high-concentration p-type semiconductor region 38 is formed on the surface of the n-type semiconductor region 36 so as to partially touch the p-type plug region 39. In the sensor 114, pn-junctions j are formed among each n-type semiconductor region 36 or 33, the p-type semiconductor region 38, the second p-type semiconductor well region 352, and the p-type plug region 39.

FIGS. 9A to 9E show a method for producing the sensor 114.

Figure 9A:
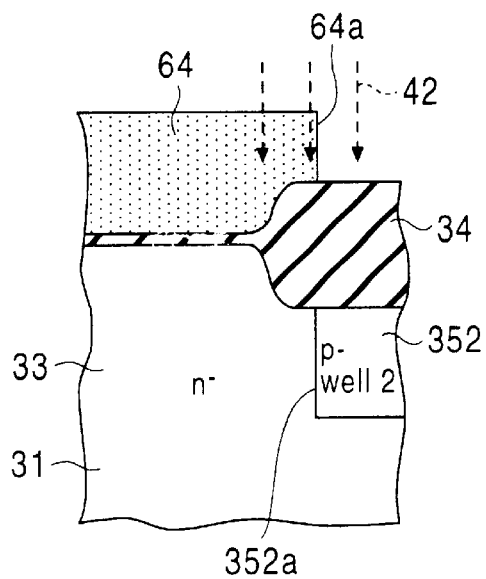
FIGS. 9A to 9E are sectional views showing a process for producing the sensor in FIG. 8.

Initially, as shown in FIG. 9A, after forming, on the surface of an n-type semiconductor substrate 31, a device isolation layer 34 resulting from local oxidation, a predetermined pattern photoresist layer 64 that covers a region for forming a sensor and that has an end 64a on the device isolation layer 34 is formed, and the photoresist layer 64 is used as a mask to perform ion implantation of a p-type impurity 42, whereby a second p-type semiconductor well region 352. The second p-type semiconductor well region 352 is formed so that its end 352a is positioned to be inner than the end of the device isolation layer 34. The second p-type semiconductor well region 352 is simultaneously formed in a process where the p-type semiconductor well region 55 in the peripheral circuit's CMOS transistor is formed as described above.

Figure 9B:
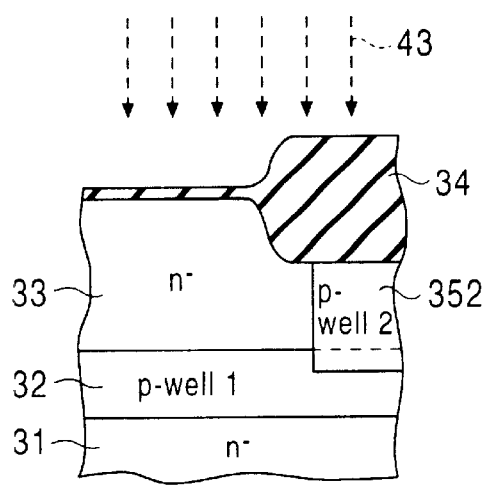

Next, as shown in FIG. 9B, after removing the photoresist layer 64, a first p-type semiconductor well region 32 touching the lower part of the second p-type semiconductor well region 352 is formed at a predetermined depth of the substrate 31 by performing ion implantation of a p-type impurity on the entire region for forming the sensor part, which includes the lower part of the device isolation layer 34. By forming the first p-type semiconductor well region 32, a low-concentration n-type semiconductor region 33 including an isolated portion of the substrate 31 is formed in a region surrounded by the first p-type semiconductor well region 32 and the second p-type semiconductor well region 352.

Figure 9C:
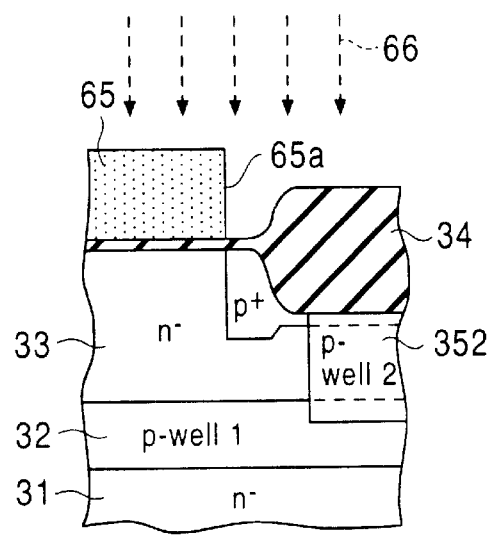

Next, as shown in FIG. 9C, a predetermined pattern photoresist layer 65 that covers the region for forming the sensor part and that has an end 65a is positioned on the sensor side (in the active region of a photodiode) apart from the end of the device isolation layer 34 is formed. By masking the photoresist layer 65, and performing ion implantation of a p-type impurity 66, a p-type plug region 39 is formed. The p-type plug region 39 is formed so that an end thereof is positioned on the sensor part forming region apart from the end of the device isolation layer 34. In other words, it is formed so as to extend from the end of the device isolation layer 34.

Figure 9D:
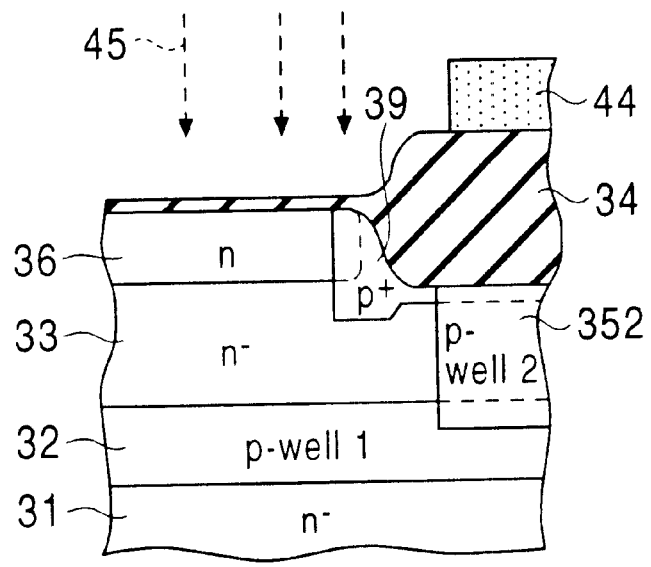

Next, as shown in FIG. 9D, by forming photoresist layer 44 on a part other than the sensor part forming region, and performing ion implantation of an n-type impurity, a high-concentration n-type semiconductor region 36 to be used as a charge accumulating region is formed on the surface of the low-concentration n-type semiconductor region 33.

Figure 9E:
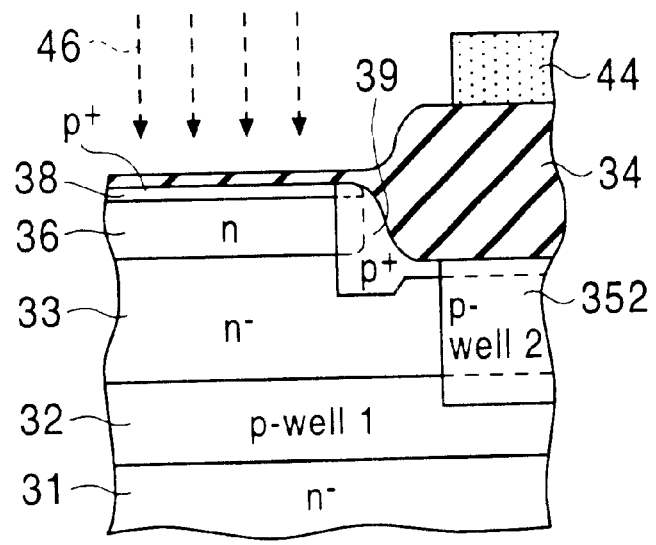

Subsequently, as shown in FIG. 9E, by performing ion implantation of a p-type impurity 46, a high-concentration p-type semiconductor region 38 is formed on the surface of the n-type semiconductor region 36 so as to touch the p-type plug region 39. With the above-described process, the desired photodiode, in which main pn-junctions are formed by each n-type semiconductor region 36 or 33 and the first p-type semiconductor well region 32, in other words, the sensor 114 is obtained.

In this construction, the impurity concentrations of the regions are as follows:
p-type semiconductor region 38>n-type semiconductor region 36;
p-type semiconductor well region 352>n-type semiconductor region 33; and
p-type plug region 39>n-type semiconductor region 36.

According to a solid-state image-sensing device provided with the sensor 114 according to this embodiment, by forming the p-type plug region (used as a channel stop region) 39 between the end of the device isolation layer 34 resulting from local oxidation and the n-type semiconductor region 36 to be used as the charge accumulating region of the sensor 114, pn-junctions of the photodiode forming the sensor 114 can be isolated from the end of the device isolation layer 34 which has crystal defects such as dislocation, i.e., the semiconductor region in the vicinity of the end of the device isolation layer 34, whereby, when the pn-junctions are reverse biased, the depletion layer can be generated at a position apart from the device isolation layer 34. Accordingly, the generation of a leakage current in the vicinity of the end of the device isolation layer 34 can be suppressed, and a dark current can be reduced. Simultaneously, the expansion of the depletion layer is deepened as described above, whereby the photoelectric conversion efficiency can be increased.

In addition, when a structure is employed in which the second p-type semiconductor well region 352 is formed to be inner than the device isolation layer 34 and in which the p-type plug region 39 is formed between the end of the device isolation layer 34 and the n-type semiconductor region 36 of the sensor 114, the distance between the gate end of the read MOS transistor and the end of the p-type plug region 39 can be more accurately set.

In other words, the sensor structure in FIG. 8 and the sensor structure in FIG. 6 are compared.

Figure 10A:
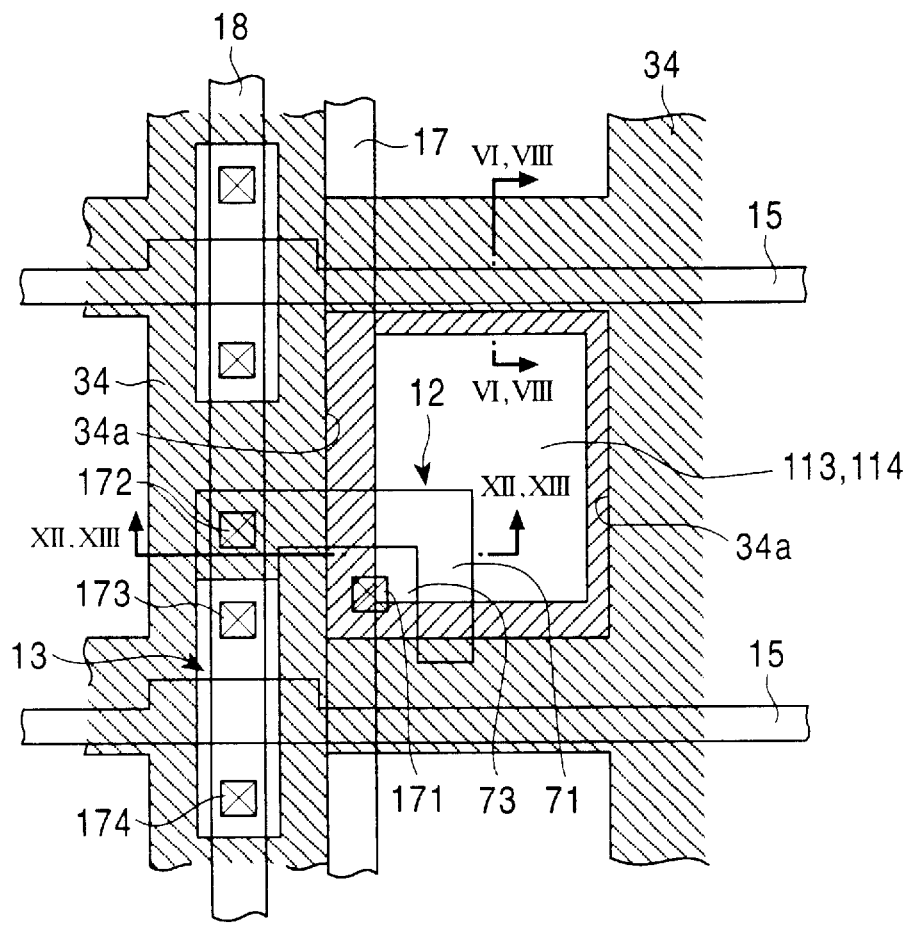
FIG. 10A a main part plan view showing an embodiment of a solid-state image-sensing device provided with a sensor according to the present invention.
Figure 10B:
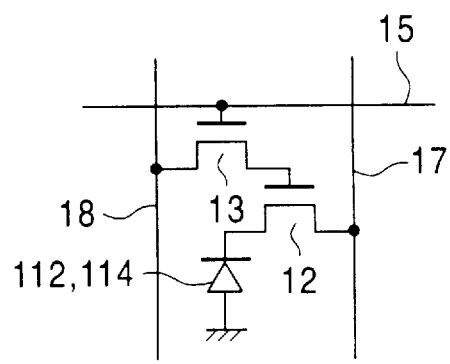
FIG. 10B is an equivalent circuit diagram of a unit pixel of the sensor.
Figure 11:
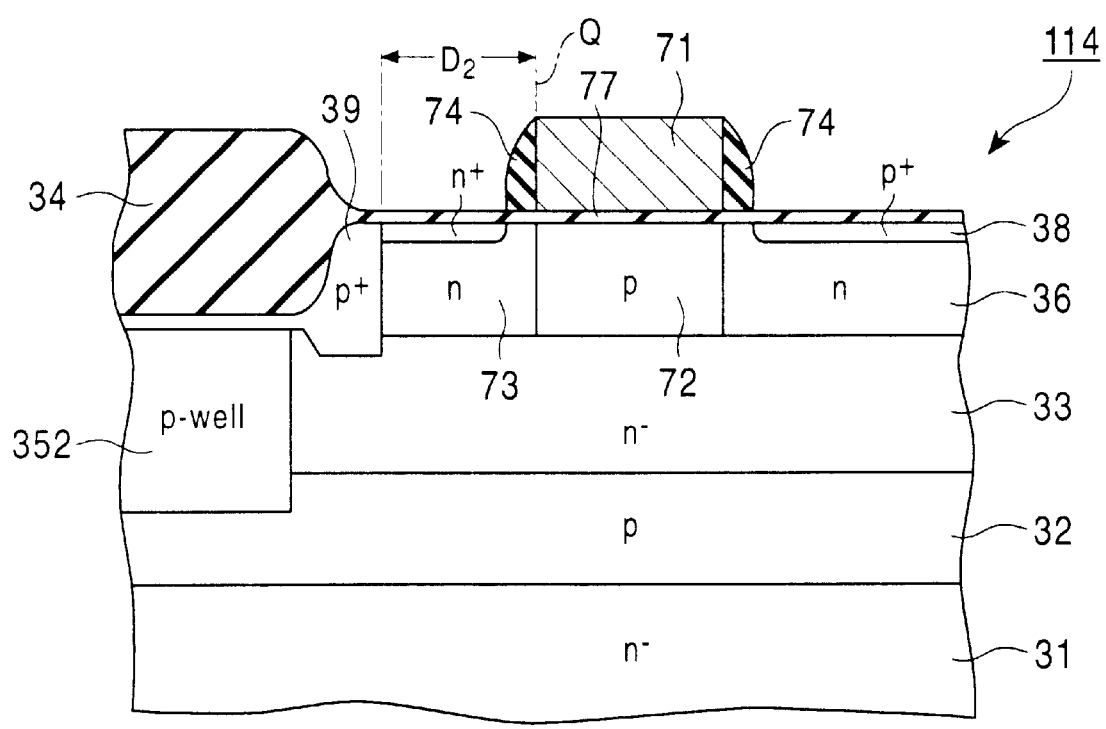
FIG. 11 is a sectional view taken on line XII,XIII-XII,XIII in FIG. 10A in the case where the sensor in FIG. 8 illustrating the present invention is included.
Figure 12:
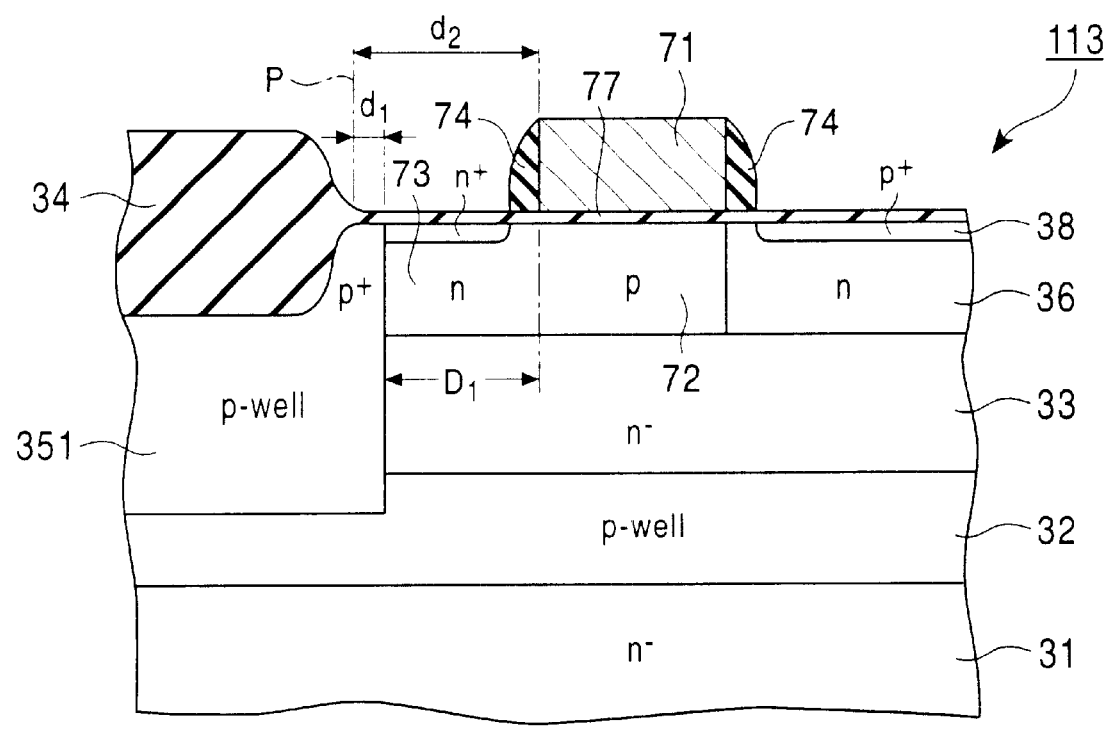
FIG. 12 is a sectional view taken on line XII,XIII-XII,XIII in FIG. 11 in the case where the sensor in FIG. 6 illustrating the present invention is included.

When it is assumed that each of the sectional structure of the sensor 114 in FIG. 8 and the sectional structure of the sensor 113 in FIG. 6 is the sectional structure on line VI,VIII-VI,VIII of a plan view showing a main part of an image capturing region in FIG. 10A, the sectional structure on line XII,XIII-XII,XIII crossing a gate electrode 71 of a read MOS transistor in FIG. 11 is as shown in FIG. 11 for the sensor 114, and is as shown in FIG. 12 for the sensor 113. FIG. 10B, is an equivalent circuit of the unit pixel in FIG. 10A. In the plan view in FIG. 10A, there are a hatched part indicating the device isolation layer 34 resulting from local oxidation and an end 34a of the device isolation layer. The inversely hatched part indicates the extended portion 351a of the second p-type semiconductor well region 351 or the p-type plug region 39. A read MOS transistor 12 has an L-shaped read gate electrode 71. A vertical-selection MOS transistor 13 has a gate electrode connected to a vertical selecting line 15. A vertical signal line 17 and one source-drain region 73 constituting the read MOS transistor 12 are connected by a contact portion 171, and the gate electrode 71 is connected to one source-drain region of the vertical selecting MOS transistor 13 via a wire (e.g., Al wire), which is not shown, and contact portions 172 and 173. Another source-drain region of the vertical selecting MOS transistor 13 is connected to a pulse line 18 via a contact portion 174.

In the sectional structures in FIGS. 11 and 12, a low-concentration p-type impurity is doped into a channel region 72 beneath a gate electrode 71 constituting the read MOS transistor 12. Each structure includes a gate insulating film 77 composed of $SiO_2$, etc., and sidewalls 74 composed of $SiO_2$, etc.

In the case of the structure of the sensor 112, an ion implantation process in which no shape is left, in other words, a process of ion implantation in the second p-type semiconductor well region 351, is performed earlier, as shown in FIG. 12. Thus, the second p-type semiconductor well region 351 and the gate electrode 71 are respectively formed with the second p-type semiconductor well region 351 aligned with the device isolation layer 34, and the gate electrode 71 aligned with the device isolation layer 34. Accordingly, the second p-type semiconductor well region 351 and the gate electrode 71 cannot be directly aligned with each other.

In other words, as shown in FIG. 12, alignment in the formation of the second p-type semiconductor well region 351 and the gate electrode 71 is performed using, as a reference point p, an end of the device isolation layer 34 left as a shape. Thus, variations occur in respective distances $d_1$ and $d_2$, and the precision of the distance $D_1$ between the gate electrode 71 and the second p-type semiconductor well region 351, which requires precision, decreases, so that characteristic variation between lots may increase.

Conversely, in the case of the sensor 114, as shown in FIG. 11, after forming a read gate electrode 71, a p-type plug region 39 is formed by performing ion implantation, while using an end of the gate electrode 71 as a reference. Thus, alignment precision between the gate electrode 71 and the p-type plug region 39 is increased to increase the precision of the distance $D_2$ between the gate electrode 71 and the p-type plug region 39. This can expand the opening area of the sensor part, reducing the alignment margin. Also, variation between lots can be reduced.

In the structure of the sensor 114 in FIGS. 8 and 11, the dark current is intended to be further reduced by forming the p-type semiconductor region 38 on the surface of the n-type semiconductor region 36, and providing, in the bulk, all pn-junctions in portions excluding the gate end. Otherwise, a structure in which the p-type semiconductor region 38 is omitted can be employed.

Figure 14:
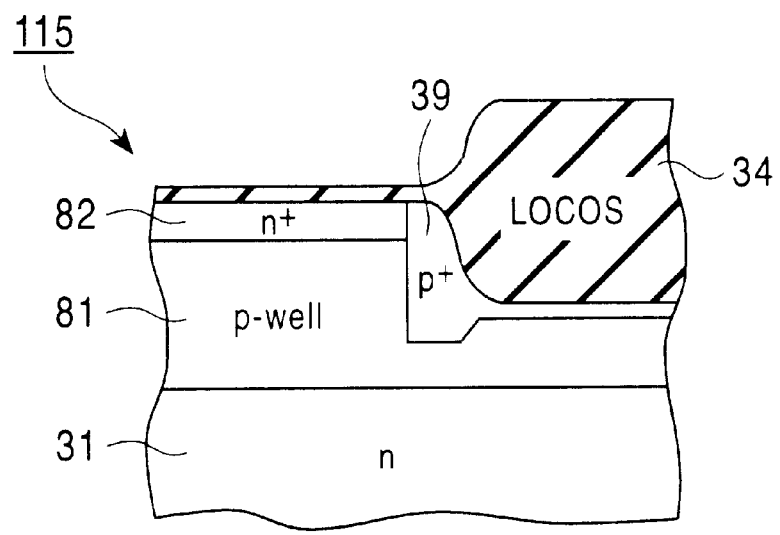
FIG. 14 is a main part sectional view showing another embodiment of the sensor in the solid-state image-sensing device according to the present invention.

FIG. 14 shows still another embodiment of the sensor 11 (see FIG. 1) according to the present invention.

A sensor 115 is formed by: forming a device isolation layer 34 resulting from local oxidation after forming a p-type semiconductor well region 31 of a first conductivity type, e.g., a p-type, on a semiconductor substrate of a second conductivity type, e.g., an n-type; forming, in the device isolation region, an n-type semiconductor region 82 to be used as a charge accumulating region; forming a pn-junction between the n-type semiconductor region 82 and the p-type semiconductor well region 81 so that a photodiode is formed; and forming a p-type plug region 39 between the n-type semiconductor region 82 and an end of the device isolation layer 34.

Figure 15:
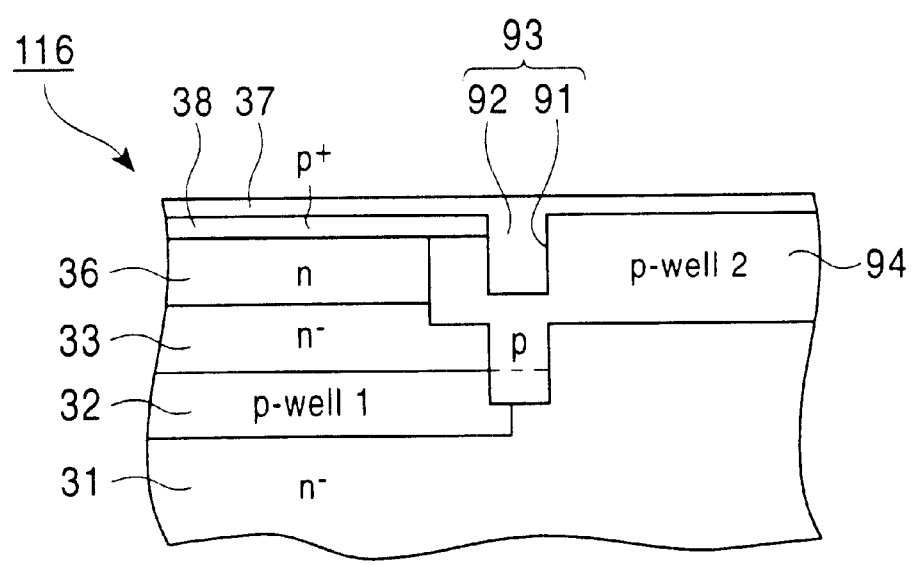
FIG. 15 is a sectional view showing another embodiment of the sensor in the solid-state image-sensing device according to the present invention.

The sensor 115 has a structure in which the p-type plug region 39 is added to the structure in FIG. 15.

Also in a solid-state image-sensing device provided with the above-described sensor 115, by forming the p-type plug region 39 between the n-type semiconductor region 82 and the device isolation layer 34, the leakage current at the end of the device isolation layer 34 can be suppressed, and the dark current can be reduced.

Each of the above-described embodiments describes a case in which the insulating layer resulting from local oxidation is used as a device isolation layer for a solid-state image-sensing device.

The present invention may be applied to a solid-state image-sensing device using, as its device isolation layer, a device isolation layer resulting from trench isolation, so-called "STI (shallow trench isolation)". Trench device isolation enables micro-fabrication and high integration of pixels, compared with device isolation resulting from local oxidation.

Figure 16:
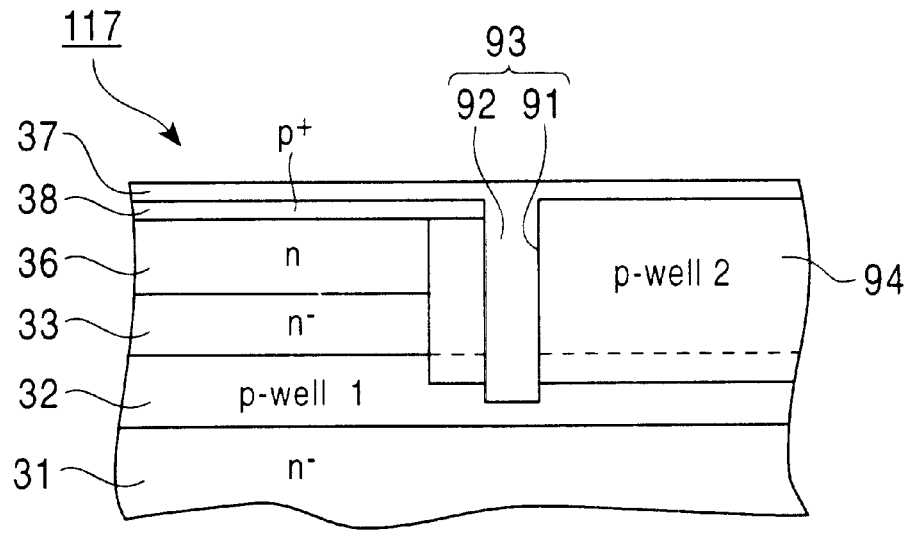
FIG. 16 is a sectional view showing another embodiment of the sensor in the solid-state image-sensing device according to the present invention.
Figure 17:
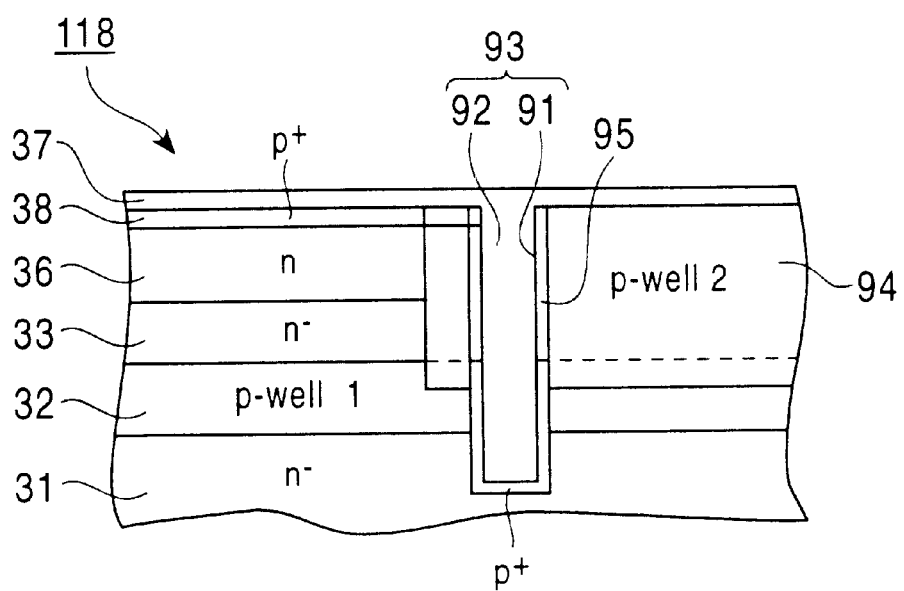
FIG. 17 is a sectional view showing another embodiment of the sensor in the solid-state image-sensing device according to the present invention.

Next, using FIGS. 15 to 17, an embodiment applied to a solid-state image-sensing device using trench device isolation is described.

FIG. 15 shows another embodiment of the sensor 11 in the above-described solid-state image-sensing device 10.

A sensor (photodiode) 116 is formed by forming, in a semiconductor substrate 31 of a second conductivity type, e.g., an n-type, a trench device isolation layer 93 composed of a trench 91 for pixel isolation and an insulating layer 92 such as SiO$_2$, which is embedded in the trench 91, and sequentially forming, as described above, a first p-type semiconductor well region 32, a low-concentration n-type semiconductor region 33 thereon, an n-type semiconductor region 36 thereon to be used as a charge accumulating region, and a high-concentration p-type semiconductor region 38 between the surface of the region 36 and an insulating film 37, in a pixel region on the n-type semiconductor substrate 31.

In this embodiment, in particular, a second p-type semiconductor well region 94 leading to the first p-type semiconductor well region 32 is formed excluding the side of the sensor 116, and a portion of the second p-type semiconductor well region 94 is extended projecting on the pixel region side of the sensor 116 so as to surround the interfaces of the trench 91 of the trench device isolation region 93 for pixel isolation.

In this embodiment, the trench 91 is formed at approximately a depth reaching the low-concentration n-type semiconductor well region 33. The first p-type semiconductor well region 32 is formed so as to end at a portion corresponding to the bottom of the trench device isolation layer 93 in the second p-type semiconductor well region 94. The second p-type semiconductor well region 94 is formed so that each portion is at a uniform depth, with the trench 93 formed.

FIG. 16 shows another embodiment of the sensor 11 (see FIG. 1) according to the present invention.

A sensor (photodiode) 117 according to this embodiment is similarly formed as described above by forming, in a semiconductor substrate 31 of a second conductivity type, e.g., an n-type, a trench device isolation layer 93 composed of a trench 91 for pixel isolation and an insulating layer 92 such as SiO$_2$, which is embedded in the trench 91, and sequentially forming a first p-type semiconductor well region 32, a low-concentration n-type semiconductor region 33 thereon, an n-type semiconductor region 36 thereon to be used as a charge accumulating region, and a high-concentration p-type semiconductor region 38 between the surface of the region 36 and an insulating film 37, in a pixel region on the n-type semiconductor substrate 31.

In this embodiment, in particular, a second p-type semiconductor well region 94 leading to the first p-type semiconductor well region 32 is formed excluding the side of the sensor 116, and a portion of the second p-type semiconductor well region 94 is extended projecting on the pixel region side of the sensor 117 so as to surround the interfaces of the trench 91 of the trench device isolation layer 93.

In this embodiment, the first p-type semiconductor well region 32 is formed overall, and the trench 91 of the trench device isolation layer 93 is formed so as to lead to the first p-type semiconductor well region 32. Concerning the trench 91, its bottom and side are surrounded by the first and second p-type semiconductor well regions 32 and 94.

FIG. 17 shows another embodiment of the sensor 11 (see FIG. 1) according to the present invention.

A sensor (photodiode) 118 according to this embodiment is similarly formed as described above by: forming, in a semiconductor substrate 31 of a second conductivity type, e.g., an n-type, a trench device isolation layer 93 composed of a trench 91 for pixel isolation and an insulating layer 92 such as SiO$_2$, which is embedded in the trench 91; forming a high-concentration p-type plug region 95 at the interfaces of the trench 91; and sequentially forming a first p-type semiconductor well region 32, a low-concentration n-type semiconductor region 33 thereon, an n-type semiconductor region 36 thereon to be used as a charge accumulating region, and a high-concentration p-type semiconductor region 38 between the surface of the region 36 and an insulating film 37, in a pixel region on the n-type semiconductor substrate 31. The high-concentration p-type plug region 95 covers all the trench's interfaces between the insulating layer 92 and silicon (Si).

In this embodiment, in particular, a second p-type semiconductor well region 94 leading to the first p-type semiconductor well region 32 is formed excluding the side of the sensor 118, and a portion of the second p-type semiconductor well region 94 is extended projecting on the pixel region side of the sensor 117 so as to surround the interfaces of the trench 91 of the trench device isolation layer 93.

In this embodiment, the trench 91 is formed leading to the n-type semiconductor substrate 31, and the first p-type semiconductor well region 32 is formed overall. The trench 91 has a side overall surrounded by the first and second p-type semiconductor well regions 32 and 94.

FIGS. 18A to 20C show producing methods for realizing the above-described sensors 116, 117, and 118.

Figure 18A:
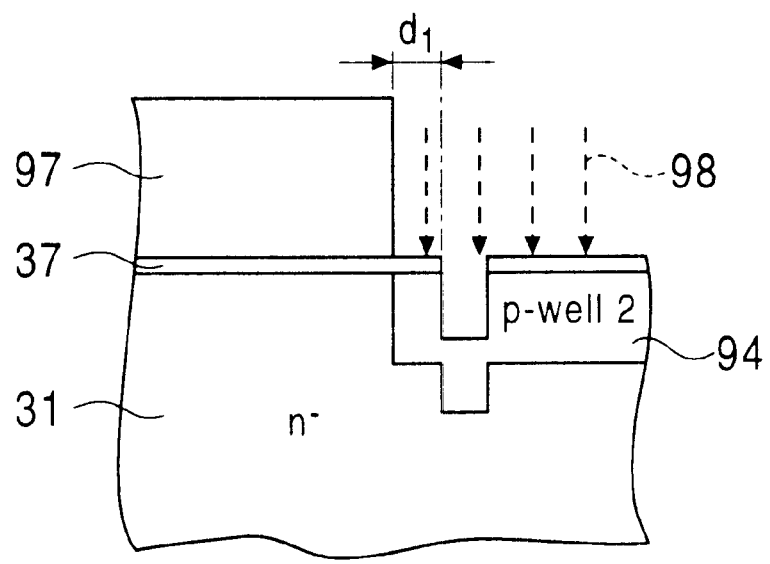
FIGS. 18A and 18B are process charts showing a method (according to an embodiment of the present invention) for producing a sensor part obtained by trench device isolation.
Figure 18B:
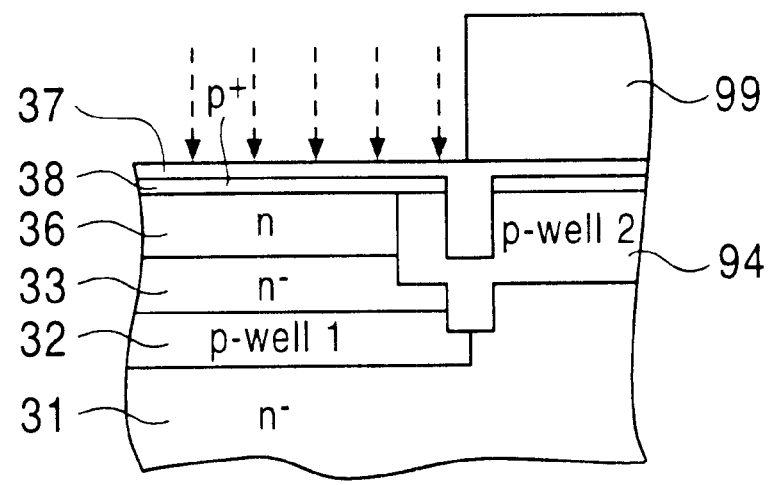

The production example in FIGS. 18A and 18B is described below.

Initially, as shown in FIG. 18A, an insulating film 37 composed of, for example, SiO$_2$ is formed on an n-type semiconductor substrate 31, and a trench 91 for trench isolation is formed on the semiconductor substrate 31, together with the insulating film 37. Next, an active region isolated at distance d, from an edge of the trench 91, in other words, a resist mask 97, is formed, and by performing ion implantation of a p-type impurity via the resist mask 97, a second p-type semiconductor well region 94 is formed on the semiconductor substrate 31 so as to project into the pixel region side.

At this time, the second p-type semiconductor well region 94 is formed around the sides and bottom of the trench 91 so as to have sufficient width and depth.

Next, as shown in FIG. 18B. by using chemical vapor deposition (CVD) to embed an insulating film, for example, an $SiO_2$ film 92, in the trench 91, and planarize it, a trench device isolation layer 93 consisting of the trench 91 and the embedded insulating film 92 is formed.

After that, excluding the pixel region, a resist mask 99 is formed so that an end thereof is positioned on the trench device isolation layer 93. By performing selective ion implantation of p-type and n-type impurities into the pixel region via the resist mask 99, a first p-type semiconductor well region 32 connected to a second p-type semiconductor well region 94 is formed at a deep position of the substrate 31, an n-type semiconductor well region 36 to be used as a charge accumulating region is formed on the surface of the substrate 31, and a high-concentration p-type semiconductor region 38 is formed at the interface between the n-type semiconductor region 36 and the insulating film 37 so as to be connected to the second p-type semiconductor well region 94.

A portion of the substrate 31 between the top n-type semiconductor region 36 and the p-type semiconductor well region 32 is used as a low-concentration n-type semiconductor region 33.

Ion implantation for the first p-type semiconductor well region 32, the n-type semiconductor region 36, and the high-concentration p-type semiconductor region 38 is shown by one illustration. However, it may be different processes for convenience of forming other portions.

With this process, the desired sensor is formed. This sensor is formed as a so-called "hole accumulation diode (HAD)" sensor by the high-concentration p-type semiconductor region 38, the n-type semiconductor regions 36 and 33, and the first p-type semiconductor well region 32.

Figure 19A:
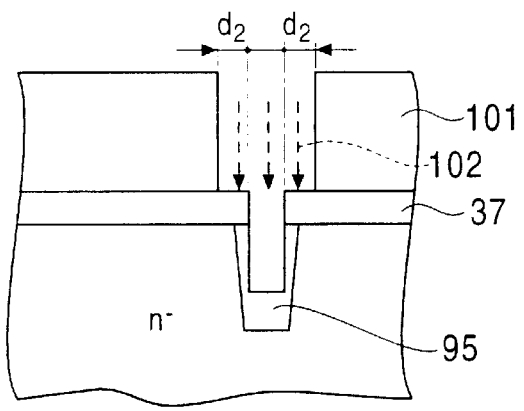
FIGS. 19A, 19B, and 19C are process charts showing a method (according to another embodiment of the present invention) for producing a sensor part obtained by trench device isolation.
Figure 19B:
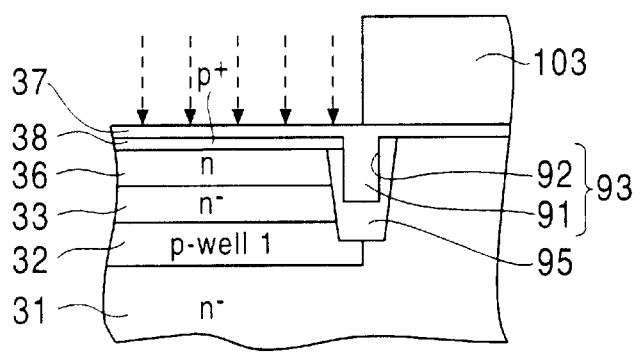
Figure 19C:
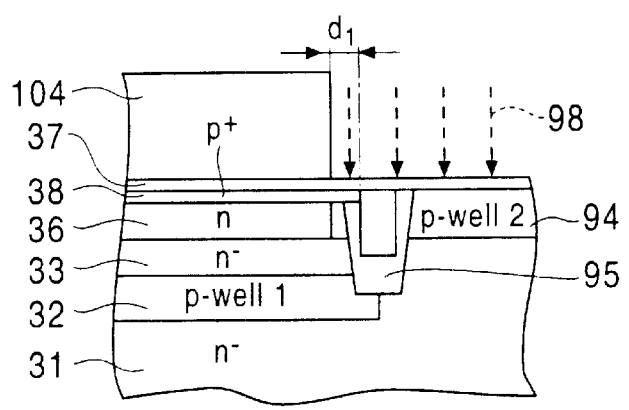

The production example in FIGS. 19A to 19C is described.

At first, as shown in FIG. 19A, an insulating film 37 composed of, for example, $SiO_2$, is formed on the surface of the n-type semiconductor region 31, and a trench 91 for trench isolation is formed in the semiconductor region 31, together with the insulating film 37.

Next, excluding the trench 91 and a portion isolated by predetermined distance $d_2$ from ends of the trench 91, a resist mask 101 is formed on the entire surface of the other portions. By performing ion implantation of a p-type impurity via the resist mask 101, a high-concentration p-type semiconductor layer for connecting a first p-type semiconductor well region 32 and a second p-type semiconductor well region 32, in other words, a so-called "p-type semiconductor plug layer" 95, is formed.

The p-type semiconductor plug layer 95 is formed around the sides and bottom of the trench 91 so as to cover the trench 91.

Next, as shown in FIG. 19B, by using chemical vapor deposition (CVD) to embed an insulating film, for example, an $SiO_2$ film 92 in the trench 91, and planarizing it, a trench device isolation layer 93 consisting of the trench 91 and the embedded insulating film 92 is formed.

Subsequently, a resist mask 103 is formed so that an end thereof is positioned on the trench device isolation layer 93, excluding the pixel region. By performing selective ion implantation of p-type and n-type impurities via the resist mask 103, a first p-type semiconductor well region 32 connected to the p-type plug region 95 is formed at a deep position of the substrate 31, a n-type semiconductor region 36 to be used as a charge accumulating region is formed on the surface of the substrate 31, and a high-concentration p-type semiconductor region 38 connected to the p-type plug region 95 is formed at the interface of the n-type semiconductor region 36 with the insulating film 37.

A portion of the substrate 31 between the top n-type semiconductor region 36 and the p-type semiconductor well region 32 is used as a low-concentration n-type semiconductor region 33.

Ion implantation for the first p-type semiconductor well region 32, the n-type semiconductor region 36, and the high-concentration p-type semiconductor region 38 is shown by one illustration. However, it may be different processes for convenience of forming other portions.

Next, as shown in FIG. 19C, a resist mask 104 is formed in the pixel region so as to be isolated by predetermined distance $d_1$ across the p-type plug region 95 from an end of the trench 91 of the trench device isolation layer 93. By performing ion implantation of a p-type impurity via the resist mask 104, a second p-type semiconductor well region 94 is formed so that part thereof extends from the trench device isolation layer 93 to the pixel region.

The first p-type semiconductor well region 32 and the second p-type semiconductor well region 94 are connected by the p-type plug region 95.

With this process, the desired sensor is formed.

Figure 20A:
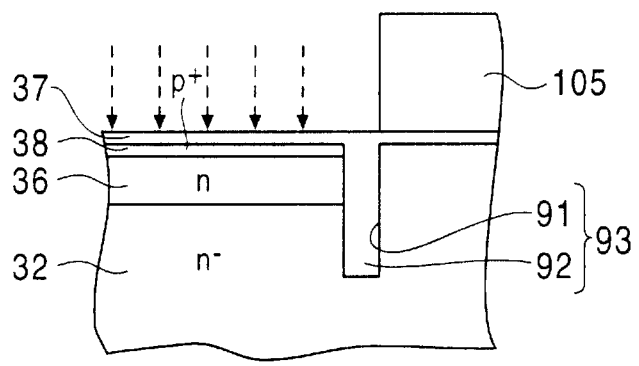
FIGS. 20A, 20B, and 20C are process charts showing a method (according to another embodiment of the present invention) for producing a sensor part obtained by trench device isolation.
Figure 20B:
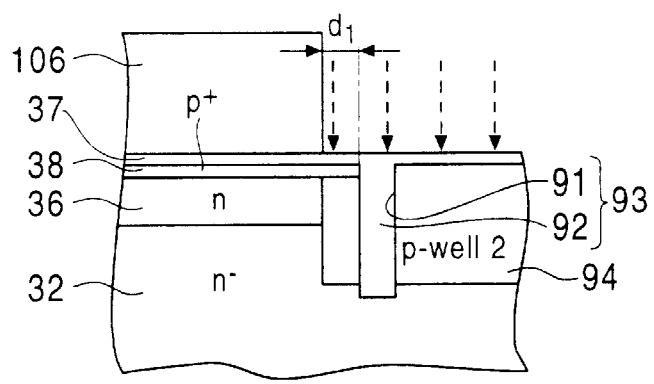
Figure 20C:
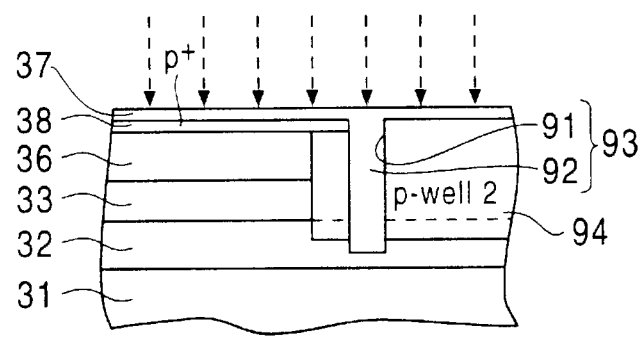
Figure 21:
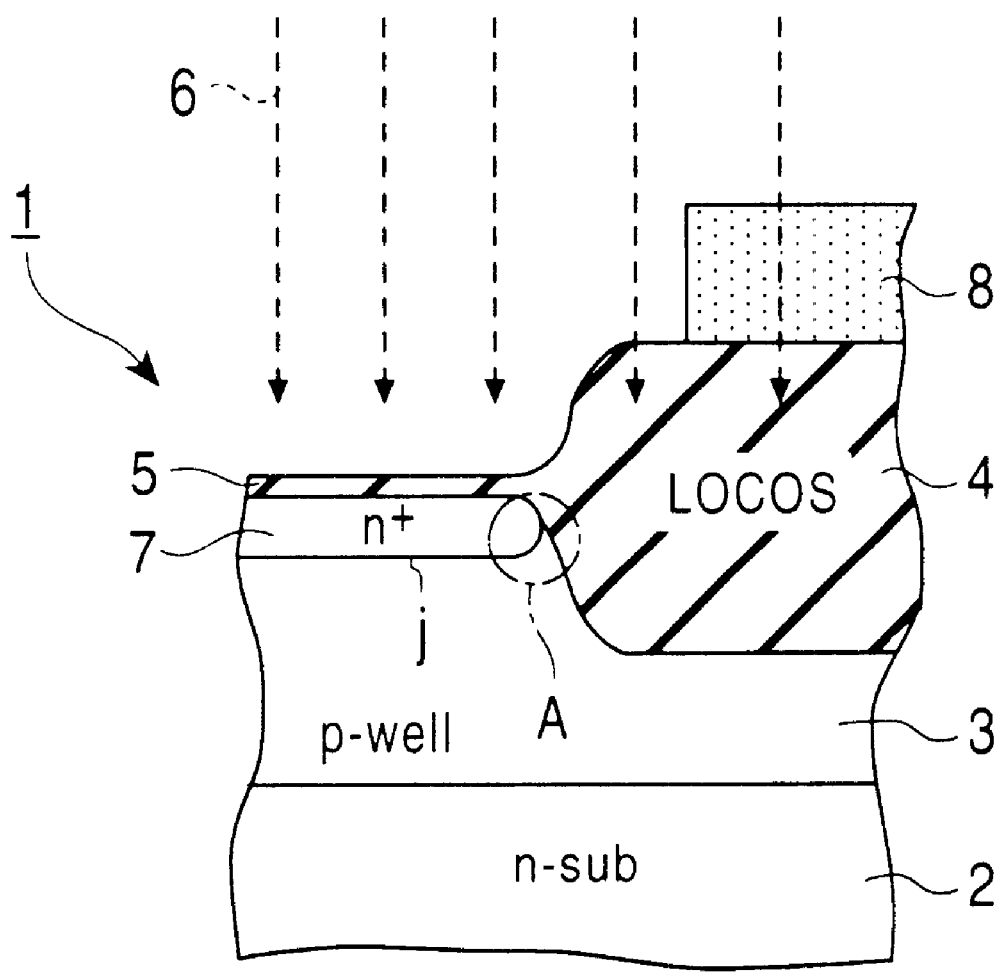
FIG. 21 is a main part sectional view showing a sensor part in a conventional solid-state image-sensing device.

The production example in FIGS. 20A to 20C is described.

At first, as shown in FIG. 20A, an insulating film 37 composed of, for example, $SiO_2$, etc., is formed on the surface of an n-type semiconductor substrate 31, and a trench 92 for trench isolation is formed on the semiconductor substrate 31, together with the insulating film 37. Next, by using chemical vapor deposition (CVD) to embed an insulating film, for example, an $SiO_2$ film 92 in the trench 91, and planarizing it, a trench device isolation layer 93 consisting of the trench 91 and the embedded insulating film 92 is formed.

Subsequently, excluding the pixel region isolated by the trench device isolation layer 93, a resist mask 105 is formed. By performing selective ion implantation via the resist mask 105, an n-type semiconductor region 38 to be used as a charge accumulating region is formed on the surface of the substrate 31, and a high-concentration p-type semiconductor region 38 is formed on the surface of the p-type semiconductor region 38.

Although ion implantation for the n-type semiconductor region 36 and the high-concentration p-type semiconductor region 38 is shown by one illustration, it may be different processes for convenience of forming the other portions.

Next, as shown in FIG. 20B, a resist mask 106 is formed in the pixel region so as to be isolated by distance $d_1$ from an end of the trench 91 of the trench device isolation layer 93. By performing ion implantation of a p-type impurity via the resist mask 106, a second p-type semiconductor well region 94 is formed so that part thereof extends from the trench device isolation layer 93 to the pixel region.

Next, as shown in FIG. 20C, by performing overall ion implantation of a p-type impurity, a first p-type semiconductor well region 32 connected to the bottom of the second p-type semiconductor well region 94 is formed at a deep position of the substrate 31. A portion of the substrate 31 between the top n-type semiconductor region 36 and the first p-type semiconductor well region 32 is used as a low-concentration n-type semiconductor region 33.

With this process, the desired sensor is formed.

The above-described sensor 116 in FIG. 15 can be produced in accordance with, for example, the production example in FIGS. 19A and 19B and the production example in FIGS. 20A to 20C. In other words, when the bottom of the second p-type semiconductor well region 94 is shallower than the first p-type semiconductor well region 32, and a portion therebetween is an n⁻ semiconductor region 33, production can be enabled by employing ion implantation in FIGS. 19A and 19B in order to connect the first and second p-type semiconductor regions 32 and 94, and by employing plug ion implantation in FIGS. 20A to 20C.

The above-described sensor 117 in FIG. 16 can be produced in accordance with, for example, the production example in FIGS. 20A to 20C.

The above-described sensor 118 in FIG. 18 can be produced in accordance with, for example, the production example in FIGS. 19A to 19C.

According to a solid-state image-sensing device provided with the above-described sensors 116, 117, and 118, the p-type semiconductor region 94 or the p-type semiconductor regions 94 and 95 are formed so as to extend from the trench device isolation layer 93 to the n-type semiconductor regions 33 and 36 of the sensor. In other words, the semiconductor interface with the trench device isolation layer 93 isolating the sensor 116, 117, or 118, is surrounded by a p-type semiconductor region, for example, the second p-type semiconductor well region 94, the first and second semiconductor well regions 32 and 94, or the p-type plug region 95 and the second p-type semiconductor well region 94, etc.

In the semiconductor interface with the trench device isolation layer 93, there are crystal defects such as dislocation. This interface having crystal defects is incorporated into a p-type semiconductor region of a conductivity type opposite to the conductivity type of the n-type semiconductor region 36 as a charge accumulating region of the sensor.

With this construction, the photodiode's pn-junction forming the sensor 116, 117, or 118 can be isolated from the interface of the trench device isolation layer 93 having crystal defects such as dislocation, and when the pn-junction is reverse biased, depletion in the interface of the trench device isolation layer 93 and its vicinity can be prevented.

Therefore, the generation of leakage current from the interface and its vicinity can be suppressed, and dark current can be reduced.

When the sensor part is formed as a HAD sensor in which the p-type semiconductor region 38 is formed on the surface of the n-type semiconductor region, all pn-junctions are provided in the bulk, excluding those in the gate end, so that the dark current can be further reduced.

In the foregoing embodiments, cases in which the present invention is applied to a CMOS solid-state image-sensing device. However, the present invention may be applied to a MOS solid-state image-sensing device.

What is claimed is:

1. A method for producing a solid-state image-sensing device, comprising the step of forming, by performing ion implantation, a semiconductor region after forming a device isolation layer resulting from local oxidation, the device isolation layer isolating pn-junction sensor parts in correspondence with pixels, the conductivity type of said semiconductor region being opposite to the conductivity type of a charge accumulating region of each of the sensor parts, wherein an end of the semiconductor region is positioned at the side of the parts except for an end of the device isolation layer.

2. A method for producing a solid-state image-sensing device including pn-junction sensor parts isolated corresponding to pixels by a device isolation layer resulting from trench isolation, said solid-state image-sensing device comprising a semiconductor region of a conductivity type opposite to the conductivity type of the charge accumulation region of each of said sensor parts, said semiconductor region formed to extend from said device isolation layer to a pixel region, said method comprising the step of:

forming the semiconductor region by a second semiconductor well region formed between a first semiconductor well region and the device isolation layer.

3. A method for producing a solid-state image-sensing including pn-junction sensor parts isolated corresponding to pixels by a device isolation layer resulting from trench isolation, said solid-state image-sensing device comprising a semiconductor region of a conductivity type opposite to the conductivity type of the charge accumulation region of each of said sensor parts, said semiconductor region formed to extend from said device isolation layer to a pixel region, said method comprising the step of:

after forming the device isolation layer, forming the semiconductor region by forming, beneath the device isolation layer, a second semiconductor well region leading to a first semiconductor well region.

4. A method for producing a solid-state image-sensing device, comprising:

a step for forming a device isolation layer resulting from local oxidation, the device isolation layer isolating pn-junction sensor parts corresponding to pixels, and for forming a gate electrode of a read transistor connected to each of the sensor parts; and forming, by performing ion implantation, a semiconductor region of a conductivity type opposite to the conductivity type of the charge accumulating region of each of the sensor parts so that an end of the semiconductor region is positioned at the side of the sensor parts except for an end of the device isolation layer, with the gate electrode being used as a reference position.

5. A method for producing a solid-state image-sensing device, comprising the step of forming a semiconductor region of a conductivity type opposite to the conductivity type of a charge accumulating region in each of pn-junction sensor parts so as to surround a device isolation layer resulting from trench isolation, said device isolation layer isolating said pn-junction sensor parts corresponding to pixels.

6. A method for producing a solid-state image-sensing device, comprising the step of forming, after forming, on a semiconductor substrate, trenches for isolating pn-junction sensor parts corresponding to pixels, and after forming a semiconductor region of a conductivity type opposite to the conductivity type of a charge accumulating region of each of the sensor parts so as to surround each trench, a device isolation layer by embedding an insulating material in each trench.

* * * * *